(12) United States Patent
Ye

(10) Patent No.: US 11,201,316 B2
(45) Date of Patent: Dec. 14, 2021

(54) DISPLAY PANEL

(71) Applicant: Wuhan China Star Optoelectronics Semiconductor Display Technology Co., Ltd., Wuhan (CN)

(72) Inventor: Shiqian Ye, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 96 days.

(21) Appl. No.: 16/846,344

(22) Filed: Apr. 12, 2020

(65) Prior Publication Data

US 2021/0210730 A1 Jul. 8, 2021

(51) Int. Cl.
*H01L 51/52* (2006.01)
*H01L 27/32* (2006.01)
*H01L 51/50* (2006.01)

(52) U.S. Cl.
CPC ...... *H01L 51/5265* (2013.01); *H01L 27/3246* (2013.01); *H01L 51/5036* (2013.01); *H01L 51/5056* (2013.01); *H01L 51/5072* (2013.01); *H01L 51/5088* (2013.01); *H01L 51/5092* (2013.01); *H01L 51/5096* (2013.01); *H01L 2251/558* (2013.01)

(58) Field of Classification Search
CPC ............. H01L 27/3225; H01L 27/3246; H01L 51/5265; H01L 51/5271; H01L 2251/558; H01L 51/5056; H01L 51/5072; H01L 51/5088; H01L 51/5092; H01L 51/5096
See application file for complete search history.

(56) References Cited

U.S. PATENT DOCUMENTS

| | | | |
|---|---|---|---|
| 2013/0146861 A1* | 6/2013 | Kurata | H01L 27/3211 257/40 |
| 2017/0213876 A1* | 7/2017 | Ohsawa | H01L 51/5203 |
| 2017/0294624 A1 | 10/2017 | Xu et al. | |
| 2017/0365817 A1* | 12/2017 | Wang | H01L 51/56 |
| 2018/0138248 A1 | 5/2018 | Maeda | |
| 2018/0190941 A1* | 7/2018 | Lee | H01L 51/5004 |
| 2018/0301656 A1 | 10/2018 | Ji | |
| 2018/0358417 A1* | 12/2018 | Hamada | H01L 51/5072 |
| 2019/0157358 A1 | 5/2019 | Maeda | |
| 2019/0189702 A1 | 6/2019 | Park et al. | |
| 2019/0189969 A1 | 6/2019 | Youn et al. | |
| 2019/0207166 A1 | 7/2019 | Lee et al. | |
| 2020/0075693 A1* | 3/2020 | Polyakov | G02B 5/201 |
| 2020/0176523 A1* | 6/2020 | Kim | H01L 51/504 |
| 2020/0411789 A1 | 12/2020 | Ye | |

FOREIGN PATENT DOCUMENTS

| | | |
|---|---|---|
| CN | 103081568 A | 5/2013 |
| CN | 204067441 U | 12/2014 |
| CN | 105493307 A | 4/2016 |

(Continued)

*Primary Examiner* — Michael M Trinh
(74) *Attorney, Agent, or Firm* — Nathan & Associates; Menachem Nathan

(57) ABSTRACT

A display panel including an anode layer, a functional layer, a cathode layer, and a packaging layer is provided, in which the functional layer includes a hole transport layer, a light-emitting layer, a reflective layer, and an electron transport layer. The display panel has an advantage in increasing light transmittance.

8 Claims, 2 Drawing Sheets

(56) References Cited

FOREIGN PATENT DOCUMENTS

| CN | 105609534 A | 5/2016 |
|---|---|---|
| CN | 108023023 A | 5/2018 |
| CN | 108258132 A | 7/2018 |
| CN | 109980110 A | 7/2019 |
| CN | 109980122 A | 7/2019 |
| CN | 110265558 A | 9/2019 |
| CN | 110335953 A | 10/2019 |

* cited by examiner

DISPLAY PANEL

BACKGROUND OF INVENTION

Field of Invention

The present invention relates to the field of display, and more particularly, to a display panel.

Description of Prior Art

In the maturity and widespread use in manufacturing organic light-emitting diode (OLED) screens, the screen-to-body ratio is getting higher and higher, and mobile phones having, for example, bangs screens, water drop screens, and punch screens are developed. However, these cut irregular-shaped screens lack a complete screen, resulting in regrets that the best sensory and appearance effect cannot be achieved visually, which reduces the shock effect.

In order to achieve a true full screen, sensing elements, placed on the front of the screen such as fingerprint scanner, front camera, handset, and facial recognition scanner shall be hidden on the back of the screen. Many of these sensing elements hidden on the back of the screen work by sensing change of light. Therefore, improving the light transmittance of OLED screens becomes the key to develop sensitive sensing elements and achieve true full screens.

SUMMARY OF INVENTION

The purpose of the present invention is to solve the technical problem that the conventional OLED screens have poor light transmittance.

For the above purpose, the present invention provides a display panel. The display panel includes an anode layer, a functional layer disposed at a surface of a side of the anode layer, a cathode layer disposed at a surface of a side of the functional layer away from the anode layer, and a packaging layer disposed at a surface of a side of the cathode layer away from the functional layer, in which the functional layer includes a hole transport layer disposed at the surface of the side of the anode layer, a light-emitting layer disposed at a surface of a side of the hole transport layer away from the anode layer, a reflective layer disposed at a surface of a side of the light-emitting layer away from the hole transport layer, and an electron transport layer disposed at a surface of a side of the reflective layer away from the light-emitting layer.

In one embodiment, the light-emitting layer includes a first light-emitting layer disposed at the surface of the side of the hole transport layer away from the anode layer, a second light-emitting layer disposed at the surface of the side of the hole transport layer away from the anode layer, and a third light-emitting layer disposed at the surface of the side of the hole transport layer away from the anode layer.

In one embodiment, a thickness of the first light-emitting layer is less than a thickness of the second light-emitting layer, and the thickness of the second light-emitting layer is less than a thickness of the third light-emitting layer.

In one embodiment, the reflective layer includes a first reflective layer disposed at a surface of a side of the first light-emitting layer away from the hole transport layer, a second reflective layer disposed at a surface of a side of the second light-emitting layer away from the hole transport layer, and a third reflective layer disposed at a surface of a side of the third light-emitting layer away from the hole transport layer.

In one embodiment, the first reflective layer, the second reflective layer, and the third reflective layer have the same thickness.

In one embodiment, the functional layer further includes a hole injection layer disposed between the anode layer and the hole transport layer, an electron blocking layer disposed between the hole transport layer and the light-emitting layer, a light extraction layer disposed at the surface of the side the reflective layer away from the light-emitting layer, a hole blocking layer disposed at a surface of a side of the light extraction layer away from the reflective layer, and an electron injection layer disposed at a surface of a side of the electron transport layer away from the hole blocking layer.

In one embodiment, the electron blocking layer includes a first electron blocking layer disposed between the hole transport layer and the first light-emitting layer, a second electron blocking layer disposed between the hole transport layer and the second light-emitting layer, and a third electron blocking layer disposed between the hole transport layer and the third light-emitting layer.

In one embodiment, the first electron blocking layer, the second electron blocking layer, and the third electron blocking layer have the same thickness.

In one embodiment, the display panel further includes a pixel definition layer disposed between the anode layer and the functional layer, in which the pixel definition layer has at least three through holes.

In one embodiment, the electron blocking layer, the light-emitting layer, and the reflective layer are disposed in the through holes.

The present invention achieves the technical effects that there is a microcavity formed between the reflective layer and the anode layer, such that the light having specific wavelength may be emitted to the outside of the display panel, and thus the light transmittance of the display panel is increased; accordingly, the sensor elements hidden on the back of the display screen have higher sensitivity, such that the sensing effect may be improved, and the full screen may be achieved.

BRIEF DESCRIPTION OF DRAWINGS

The specific embodiments of the present invention are described in detail below with reference to the accompanying drawings, such that the technical solutions of the present invention and other benefits will be clear.

Figure 1:
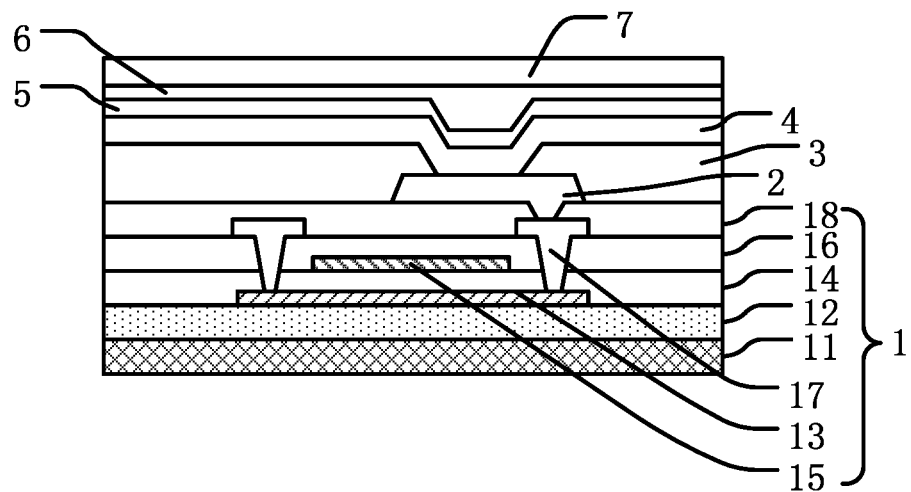
FIG. 1 is a schematic view of a structure of a display panel according to one embodiment of the present invention.

Reference numerals are described below:
array substrate: 1; anode layer: 2; pixel definition layer: 3; functional layer: 4; cathode layer: 5; protective layer: 6; packaging layer: 7; substrate: 11; buffer layer: 12; active layer: 13; gate insulating layer: 14; gate layer: 15; insulating layer: 16; source drain layer: 17; planarization layer: 18; hole transport layer: 41; light-emitting layer: 42; reflective layer: 43; electron transport layer: 44; hole injection layer: 45; electron blocking layer: 46; light extraction layer: 47;

hole blocking layer: 48; electron injection layer: 49; display screen: 100; and sensing element: 200.

DETAILED DESCRIPTION OF PREFERRED EMBODIMENTS

The technical solutions in the embodiments of the present invention are clearly illustrated in the following description with reference to the accompanying drawings of the embodiments of the present invention. It is obvious that the described embodiments are only a part of the embodiments of the present invention, rather than all of the embodiments. According to the embodiments of the present invention, the other embodiments obtained by a person skilled in the art without any creative effort fall within the scope of the present invention.

In the description of the present invention, it is to be understood that the terms referring to the direction or the position relationship, such as "center," "longitudinal direction," "lateral direction," "length," "width," "thickness", "up," "down," "forward," "backward," "left," "right," "perpendicular," "horizontal," "top," "bottom," "inside," "outside," "clockwise," and "counterclockwise," are based on the direction or the position relationship of the drawings and merely be used to conveniently and simply describe the present invention, rather than indicating or implying that the referred device or element has specific direction and be operated with the specific direction and configuration. Therefore, the directional terms a limitation to the present invention. In addition, the terms such as "first" and "second" are merely used for descriptive purposes, rather than indicating or implying the relative importance or the number of the referred technical features. Furthermore, a feature defined by "first" or "second" may indicate or imply that one or more features are included. In the description of the present invention, "a plurality" means that the number is two or more than two, unless specifically defined otherwise.

In the description of the present invention, unless specifically defined otherwise, it is to be understood that the terms "installation," "being connected," and "connection" shall be interpreted broadly, for instance, it is possible to mean a fixing connection, a removable connection, or an integrated connection; it is possible to mean a mechanical connection, an electrical connection, or a communicable connection; it is possible to mean a direct connection or an indirect connection having intermediary; and it is possible to mean an internal connection of two elements or an interaction of two elements. For a person skilled in the art, it is possible to understand the specific meaning of the terms in the present invention by concrete condition.

In the present invention, unless specifically defined otherwise, a structure in which a first feature is "on" or "below" a second feature may include an embodiment in which the first feature is in direct contact with the second feature, and may also include an embodiment in which the first feature and the second feature are not in direct contact with each other, but are contacted via an additional feature formed therebetween. Furthermore, a first feature "on," "above," or "on top of" a second feature may include an embodiment in which the first feature is right or obliquely "on," "above," or "on top of" the second feature, or just means that the first feature is at a height higher than that of the second feature; while a first feature "below," "under," or "on bottom of" a second feature may include an embodiment in which the first feature is right or obliquely "below," "under," or "on bottom of" the second feature, or just means that the first feature is at a height lower than that of the second feature.

The following disclosure provides many different embodiments or examples for implementing different structures of the present invention. Specific examples of components and arrangements are described below to simplify the disclosure of the present invention. These are, of course, merely examples and are not intended to be limiting. In addition, the present invention may repeat reference numerals and/or letters in the various examples. This repetition is for the purpose of simplicity and clarity and does not in itself dictate a relationship between the various embodiments and/or configurations discussed. Furthermore, the present invention provides various examples of specific processes and materials, but a person skilled in the art will be able to devise the applications of other processes and/or materials.

Referring to FIG. 1, this embodiment provides a display panel, which includes an array substrate 1, an anode layer 2, a pixel definition layer 3, a functional layer 4, a cathode layer 5, a protective layer 6, and a packaging layer 7.

The array substrate 1 serves as a circuit switch and includes a substrate 11, a buffer layer 12, an active layer 13, a gate insulating layer 14, a gate layer 15, an insulating layer 16, a source drain layer 17, and a planarization layer 18.

The substrate 11 is a rigid substrate, generally a glass substrate and serves as a support and a substrate.

The buffer layer 12 is disposed at an upper surface of the substrate 11 and serves as a buffer. The material of the buffer layer 12 includes an inorganic material. The inorganic material may include silicon oxide or silicon nitride, or a multilayer structure.

The active layer 13 is disposed at an upper surface of the buffer layer 12 and provides circuit support for the display panel. The material of the active layer 13 includes a semiconductor. The semiconductor may include indium gallium zinc oxide (IGZO), indium gallium titanium oxide (IGTO), and indium gallium tin zinc oxide (IGZTO).

The gate insulating layer 14 is disposed at upper surfaces of the active layer 13 and the buffer layer 12. The material of the gate insulating layer 14 includes an inorganic material. The inorganic material may include silicon oxide or silicon nitride, or a multilayer structure. The gate insulating layer 14 is disposed opposite to the active layer 13. The gate insulating layer 14 plays an insulating role for preventing the display panel from short circuiting in the internal traces.

The gate layer 15 is disposed at an upper surface of the gate insulating layer 14 and opposite to the active layer 13. The material of the gate layer 15 includes a metal material. The metal material may include molybdenum (Mo), aluminum (Al), copper (Cu), titanium (Ti), etc., or an alloy, or a multilayer structure.

The insulating layer 16 is disposed at upper surfaces of the gate layer 15 and the gate insulating layer 14. The insulating layer 16 is an interlayer insulating layer and plays an insulating role for preventing short circuiting. The material of the insulating layer 16 includes an inorganic material. The inorganic material may include silicon oxide or silicon nitride, or a multilayer structure. Through holes are disposed at the gate insulating layer and the insulating layer above the active layer 13, which facilitate the formation of electrical connection between the source drain layer 17 and the active layer 13.

The source drain layer 17 is disposed at an upper surface of the insulating layer 16 and electively connected to the active layer 13 via the through hole to form a circuit connection. The material of the source drain layer 17 includes a metal material. The metal material may include molybdenum (Mo), aluminum (Al), copper (Cu), titanium (Ti), etc., or an alloy, or a multilayer structure.

The planarization layer 18 is disposed at upper surfaces of the source drain layer 17 and the insulating layer 16. The planarization layer 18 provides a planer layer surface, which is useful for the adhesion of subsequent layers and preventing separation. Another through hole is disposed at the planarization layer 18 and opposite to the source drain layer 17. The through hole provides a channel for the anode layer 2.

The anode layer 2 is disposed at an upper surface of the planarization layer 18 and its material includes metal. The anode layer 2 is electively connected to the source drain layer 17 via the through hole on the planarization layer 18 to form an electrical connection between the anode layer 2 and the array substrate 1. The anode layer 2 has higher light reflectance value, which may be 90% to 100%.

The pixel definition layer 3 is disposed at an upper surface of the planarization layer 18 and determines the size of the light-emitting layer. A through hole of pixel definition layer is disposed on the pixel definition layer 3 and opposite to the anode layer 2. The through hole of pixel definition layer provides circuit support for the functional layer 4.

Figure 2:
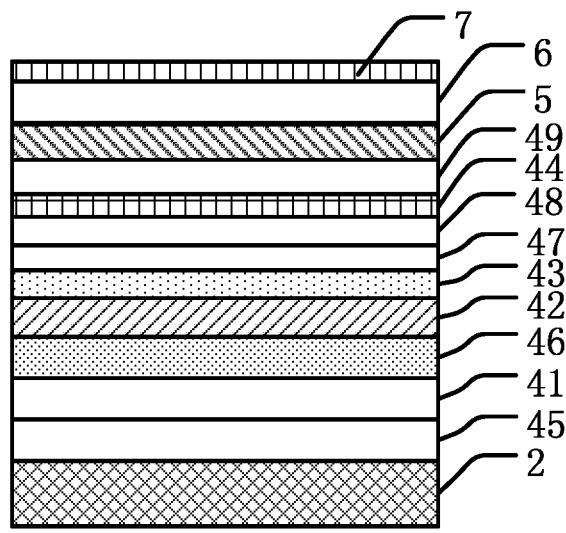
FIG. 2 is a partial schematic view of a structure of the display panel according to one embodiment of the present invention.

Referring to FIG. 2, the functional layer 4 is disposed at an upper surface of the pixel definition layer 3 and partly disposed in the through hole of pixel definition layer. The functional layer 4 includes a hole transport layer 41, a light-emitting layer 42, a reflective layer 43, an electron transport layer 44, a hole injection layer 45, an electron blocking layer 46, a light extraction layer 47, a hole blocking layer 48, and an electron injection layer 49.

The hole injection layer 45 is disposed at upper surfaces of the anode layer 2 and the planarization layer 18. The hole injection layer 45 may reduce the hole injection potential barrier, improve the hole injection efficiency, and reduce the voltage of the display panel.

The hole transport layer 41 is disposed at an upper surface of the hole injection layer 45. The hole transport layer 41 is configured to transport a hole carrier, such that the hole in the hole injection layer 45 is transported to the light-emitting layer.

Figure 3:
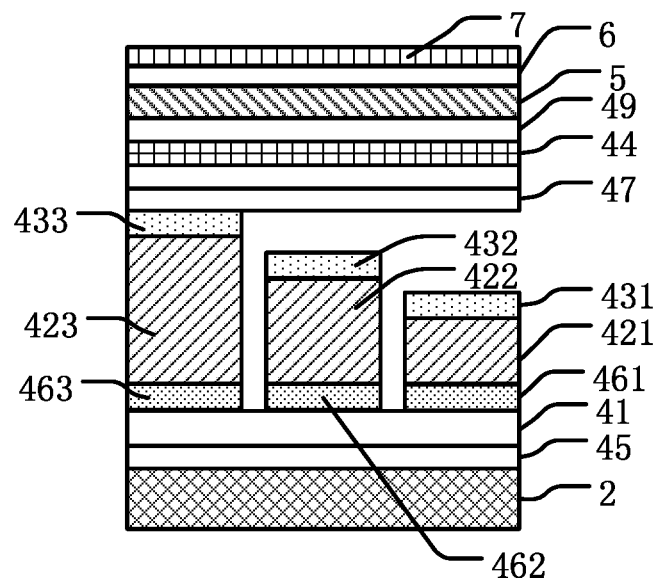
FIG. 3 is a partial schematic view of a structure of the display panel according to one embodiment of the present invention.

The electron blocking layer 46 is disposed at an upper surface of the hole transport layer 41. The electron blocking layer 46 plays a role of blocking excess electrons, preventing the excess electrons from moving to the anode layer 2 and being quenched. Referring to FIG. 3, the electron blocking layer 46 includes a first electron blocking layer 461, a second electron blocking layer 462, and a third electron blocking layer 463. The first electron blocking layer 461, the second electron blocking layer 462, and the third electron blocking layer 463 are individually disposed in a through hole of pixel definition layer. The first electron blocking layer 461, the second electron blocking layer 462, and the third electron blocking layer 463 have the same thickness.

The light-emitting layer 42 is disposed at an upper surface of the electron blocking layer 46 and configured to realize light-emitting function. The material of the light-emitting layer 42 includes a fluorescent material, which may emit one of red light, green light, and blue light. The light-emitting layer 42 is formed by fine metal mask (FMM) evaporation. Referring to FIG. 3, the light-emitting layer 42 includes a first light-emitting layer 421, a second light-emitting layer 422, and a third light-emitting layer 423. The first light-emitting layer 421 is disposed at an upper surface of the first electron blocking layer 461, the second light-emitting layer 422 is disposed at an upper surface of the second electron blocking layer 462, and the third light-emitting layer 423 is disposed at an upper surface of the third electron blocking layer 463. That is to say, the first light-emitting layer 421, the second light-emitting layer 422, and the third light-emitting layer 423 are individually disposed in a through hole of pixel definition layer. A thickness of the first light-emitting layer 421 is less than a thickness of the second light-emitting layer 422, and the thickness of the second light-emitting layer 422 is less than a thickness of the third light-emitting layer 423.

The reflective layer 43 is disposed at an upper surface of the light-emitting layer 42 and configured to realize light reflection function. The reflective layer 43 has higher reflectance value and is formed by FMM evaporation. Referring to FIG. 3, the reflective layer 43 includes a first reflective layer 431, a second reflective layer 432, and a third reflective layer 433. The first reflective layer 431 is disposed at an upper surface of the first light-emitting layer 421, the second reflective layer 432 is disposed at an upper surface of the second light-emitting layer 422, and the third reflective layer 433 is disposed at an upper surface of the third light-emitting layer 423. That is to say, the first reflective layer 431, the second reflective layer 432, and the third reflective layer 433 are individually disposed in a through hole of pixel definition layer. The first reflective layer 431, the second reflective layer 432, and the third reflective layer 433 have the same thickness.

The light extraction layer 47 is disposed at an upper surface of the reflective layer 43. Since the thicknesses of the first light-emitting layer 421, the second light-emitting layer 422, and the third light-emitting layer 423 are different, a microcavity is formed between the anode layer 2 and the reflective layer 43 when the light extraction layer 47 is adhered to the upper surface of the third reflective layer 433. The microcavity allows the light having a specific wavelength to be emitted to the outside of the display panel. The light extraction layer 47 may enhance microcavity effect to improve the efficiency of the display panel; on the other hand, due to its high refractive index, the light extraction layer 47 may enhance angle of emergence to improve the viewing angle of the display panel.

The hole blocking layer 48 is disposed at an upper surface of the light extraction layer 47. The hole blocking layer 48 plays a role of blocking holes, preventing the excess holes from moving to the cathode layer 5 and being quenched, thereby improving the efficiency of the display panel.

The electron transport layer 44 is disposed at an upper surface of the hole blocking layer 48 and configured to transport an electron.

The electron injection layer 49 is disposed at an upper surface of the electron transport layer 44. The electron injection layer 49 may reduce the electron injection potential barrier, improve the electron injection efficiency, and further reduce the voltage of the display panel. The electron transport layer 44 transports the electron in the electron injection layer 49 to the light-emitting layer 42, such that the hole and the electron collide in the light-emitting layer 42 to emit light.

The cathode layer 5 is disposed at an upper surface of the electron injection layer 49. The cathode layer 5 has extremely high light transmittance, which may be 90% to 100%, and has lower resistivity. Since the cathode layer 5 has higher light transmittance and lower resistivity, it may be formed by open mask evaporation.

The protective layer 6 is disposed at an upper surface of the cathode layer 5. The protective layer 6 plays a role of protecting the cathode layer 5, thereby effectively preventing the cathode layer 5 from being damaged during film packaging.

The packaging layer 7 is disposed at an upper surface of the protective layer 6. The packaging layer 7 plays a packaging role and prevents water and oxygen from entering into the inner of the display panel from outside, which causes damage to the display panel.

Figure 4:
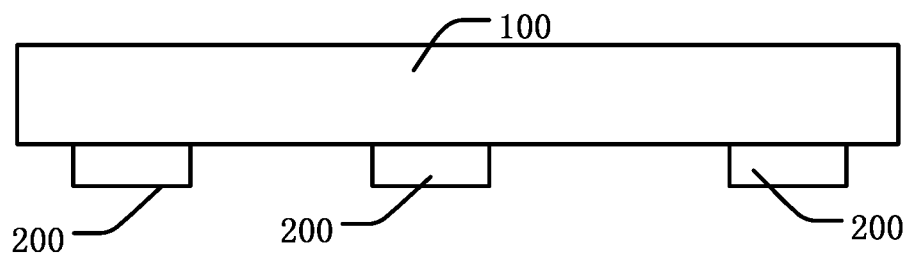
FIG. 4 is a schematic view of a position of a sensing element according to one embodiment of the present invention.

The first reflective layer 431, the second reflective layer 432, and the third reflective layer 433 may be formed by the same FMM evaporation as the first light-emitting layer 421, the second light-emitting layer 422, the third light-emitting layer 423, the first electron blocking layer 461, the second electron blocking layer 462, and the third electron blocking layer 463. A cathode layer having high light transmittance and low resistivity, such as cathode layer 5, is formed by open mask evaporation. Therefore, only in a pixel area, the anode layer 2 and the reflective layer 43 have high reflectance value and low transmittance, while in a non-pixel area, each layer has high transmittance, such that the transmittance of the display panel may be significantly increased. In this regard, referring to FIG. 4, a sensing element 200 is disposed at a back of the display screen 100. The sensing element 200 includes an element which is worked by emitting, receiving, and processing light, such as camera, fingerprint scanner, and facial recognition scanner. Since the front of the display panel has higher light transmittance, it may be ensured that the sensing element 200 hidden on the back of the display screen 100 has higher sensitivity, and its sensing effect is improved. As a result, a full screen may be achieved.

The technical effect of the display panel provided in the embodiments of the present invention is that there is a microcavity formed between the reflective layer and the anode layer, such that the light having specific wavelength may be emitted to the outside of the display panel, ensuring that the sensing elements hidden on the back of the display screen have higher sensitivity; accordingly, the sensing effect may be improved, and the full screen may be achieved.

In the above embodiments, all the embodiments have respective focuses of description. For a part that is not described in detail in an embodiment, refer to related descriptions in other embodiments.

Detailed above is a display panel according to the embodiments of the present invention. Although the principle and implementation of the present invention are described with reference to exemplary embodiments, the embodiments are only intended to help understand the technical solution and core idea of the present invention. In addition, those skilled in the art shall understand that they may still make modifications to the technical solutions described in the foregoing embodiments or make equivalent replacements to some or all technical features thereof, without departing from the scope of the technical solutions of the embodiments of the present invention.

What is claimed is:

1. A display panel, comprising:
an anode layer;
a functional layer disposed at a surface of a side of the anode layer;
a cathode layer disposed at a surface of a side of the functional layer away from the anode layer; and
a packaging layer disposed at a surface of a side of the cathode layer away from the functional layer;
wherein the functional layer comprises:
a hole transport layer disposed at the surface of the side of the anode layer;
a light-emitting layer disposed at a surface of a side of the hole transport layer away from the anode layer;
a reflective layer disposed at a surface of a side of the light-emitting layer away from the hole transport layer; and
an electron transport layer disposed at a surface of a side of the reflective layer away from the light-emitting layer;
wherein the light-emitting layer comprises: a first light-emitting layer disposed at the surface of the side of the hole transport layer away from the anode layer; a second light-emitting layer disposed at the surface of the side of the hole transport layer away from the anode layer; and a third light-emitting layer disposed at the surface of the side of the hole transport layer away from the anode layer; and
wherein the reflective layer comprises: a first reflective layer disposed at a surface of a side of the first light-emitting layer away from the hole transport layer; a second reflective layer disposed at a surface of a side of the second light-emitting layer away from the hole transport layer; and a third reflective layer disposed at a surface of a side of the third light-emitting layer away from the hole transport layer.

2. The display panel according to claim 1, wherein a thickness of the first light-emitting layer is less than a thickness of the second light-emitting layer, and the thickness of the second light-emitting layer is less than a thickness of the third light-emitting layer.

3. The display panel according to claim 1, wherein the first reflective layer, the second reflective layer, and the third reflective layer have a same thickness.

4. The display panel according to claim 1, wherein the functional layer further comprises:
a hole injection layer disposed between the anode layer and the hole transport layer;
an electron blocking layer disposed between the hole transport layer and the light-emitting layer;
a light extraction layer disposed at the surface of the side the reflective layer away from the light-emitting layer;
a hole blocking layer disposed at a surface of a side of the light extraction layer away from the reflective layer; and
an electron injection layer disposed at a surface of a side of the electron transport layer away from the hole blocking layer.

5. The display panel according to claim 4, wherein the electron blocking layer comprises:
a first electron blocking layer disposed between the hole transport layer and the first light-emitting layer;
a second electron blocking layer disposed between the hole transport layer and the second light-emitting layer; and
a third electron blocking layer disposed between the hole transport layer and the third light-emitting layer.

6. The display panel according to claim 5, wherein the first electron blocking layer, the second electron blocking layer, and the third electron blocking layer have a same thickness.

7. The display panel according to claim 4, further comprising a pixel definition layer disposed between the anode layer and the functional layer, wherein the pixel definition layer has at least three through holes.

8. The display panel according to claim 7, wherein the electron blocking layer, the light-emitting layer, and the reflective layer are disposed in the through holes.

* * * * *

UNITED STATES PATENT AND TRADEMARK OFFICE
CERTIFICATE OF CORRECTION

| | |
|---|---|
| PATENT NO. | : 11,201,316 B2 |
| APPLICATION NO. | : 16/846344 |
| DATED | : December 14, 2021 |
| INVENTOR(S) | : Shiqian Ye |

It is certified that error appears in the above-identified patent and that said Letters Patent is hereby corrected as shown below:

On the Title Page

Column 1, Insert:
--(30) Foreign Application Priority Data
Jan. 7, 2020 (CN) .................... 202010012338.4--

Signed and Sealed this
Nineteenth Day of July, 2022

*Katherine Kelly Vidal*

Katherine Kelly Vidal
*Director of the United States Patent and Trademark Office*